(12) United States Patent
Zhou et al.

(10) Patent No.: US 10,490,578 B2
(45) Date of Patent: Nov. 26, 2019

(54) ARRAY SUBSTRATE, DISPLAY PANEL AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Jideng Zhou, Beijing (CN); Wei Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 0 days.

(21) Appl. No.: 15/521,295

(22) PCT Filed: Aug. 11, 2016

(86) PCT No.: PCT/CN2016/094631
§ 371 (c)(1),
(2) Date: Apr. 23, 2017

(87) PCT Pub. No.: WO2017/143734
PCT Pub. Date: Aug. 31, 2017

(65) Prior Publication Data
US 2018/0350842 A1 Dec. 6, 2018

(30) Foreign Application Priority Data

Feb. 26, 2016 (CN) .......................... 2016 1 0109241

(51) Int. Cl.
*H01L 27/12* (2006.01)
*G02F 1/1339* (2006.01)
(Continued)

(52) U.S. Cl.
CPC .......... *H01L 27/127* (2013.01); *G02F 1/0107* (2013.01); *G02F 1/1339* (2013.01);
(Continued)

(58) Field of Classification Search
CPC ...................................... G02F 1/0107
See application file for complete search history.

(56) References Cited

U.S. PATENT DOCUMENTS

| 2006/0160259 | A1* | 7/2006 | Chiang ................. G02F 1/1339 438/26 |
| 2006/0203175 | A1* | 9/2006 | Song ..................... G02F 1/1339 349/153 |

(Continued)

FOREIGN PATENT DOCUMENTS

| CN | 103869548 A | 6/2014 |
| CN | 204116768 U | 1/2015 |
| CN | 105068373 A | 11/2015 |

OTHER PUBLICATIONS

International Search Report and Written Opinion dated Dec. 7, 2016 in PCT/CN2016/094631.
(Continued)

*Primary Examiner* — Fernando L Toledo
*Assistant Examiner* — Valerie N Newton
(74) *Attorney, Agent, or Firm* — Syncoda LLC; Feng Ma

(57) ABSTRACT

This disclosure provides an array substrate, a manufacturing method thereof, and a display panel. The array substrate includes an organic film layer disposed over a substrate, and is provided with a groove, which is configured for positioning a sealant, extends through the organic film layer, and has an opening on a side opposing to the substrate. The array substrate can further include a sealing film, which covers surfaces of the groove to thereby prevent gas release from the organic film layer.

18 Claims, 4 Drawing Sheets

(51) Int. Cl.
*G02F 1/01* (2006.01)
*G02F 1/1333* (2006.01)
*G02F 1/1343* (2006.01)
*G02F 1/1362* (2006.01)
*G02F 1/1335* (2006.01)

(52) U.S. Cl.
CPC .......... *G02F 1/1343* (2013.01); *G02F 1/1362* (2013.01); *G02F 1/133345* (2013.01); *G02F 1/133514* (2013.01); *G02F 2001/13625* (2013.01)

(56) References Cited

U.S. PATENT DOCUMENTS

2008/0001937 A1* 1/2008 Shin ................. G02F 1/136227
 345/204
2015/0062515 A1 3/2015 Tomioka et al.
2018/0159066 A1* 6/2018 Kong ..................... H01L 21/70

OTHER PUBLICATIONS

1st Office Action dated Mar. 31, 2017 in CN201610109241.9.
2nd Office Action dated Jun. 30, 2017 in CN201610109241.9.

* cited by examiner

ARRAY SUBSTRATE, DISPLAY PANEL AND MANUFACTURING METHOD THEREOF

CROSS-REFERENCE TO RELATED APPLICATION

The present application claims priority to Chinese Patent Application No. 201610109241.9 filed on Feb. 26, 2016, the disclosure of which is hereby incorporated by reference in its entirety.

TECHNICAL FIELD

This disclosure relates generally to liquid crystal display technologies, and more specifically to an array substrate, a display panel, and a manufacturing method thereof, and a display apparatus.

BACKGROUND

TFT-LCDs (Thin Film Transistor Liquid Crystal Displays) have advantages such as small sizes, low power consumption, low radiation, low manufacturing costs, etc., and have dominated the current flat-panel display market.

A TFT-LCD typically includes an array substrate, a color film substrate, and a liquid crystal layer that is sandwiched between. The array substrate and the color film substrate are configured to package the liquid crystal layer through a sealant. The array substrate typically also comprises an insulating layer, an organic film layer, a gate protection layer, and a gate electrode metal layer, all disposed under the sealant.

However, under environmental conditions such as high temperature, high pressure, or high humidity, the organic film layer has larger tensile stress difference relative to other inorganic film layers or metal film layers.

Additionally, under high temperature, the organic film layer may itself release solvent from gaps of the layers, which can cause a poorer adhesion between the organic film layer and the adjacent layers, ultimately resulting in separation of the layers disposed over the organic film layer from the sealant at part of the region, thereby reducing the sealing performance of the sealant.

SUMMARY

This disclosure provides an array substrate, a manufacturing method thereof, and a display panel, aiming to solve the issue that the sealing between the sealant and the layers bonded to it becomes poorer due to the environmental influences, such as high temperature, high pressure, and high humidity, on the organic film layer disposed below the sealant.

In one aspect, an array substrate is provided. The array substrate includes an organic film layer disposed over a substrate, and is provided with a groove, which is configured for positioning a sealant, extends through the organic film layer, and has an opening on a side opposing to the substrate.

In some preferred embodiments, the array substrate can further include a sealing film, which covers surfaces of the groove to thereby prevent gas release from the organic film layer. The sealing film can be a transparent electrode, and can comprise indium tin oxide, for example.

In some embodiments, the array substrate can further include a gate protection layer, which is disposed between the substrate and the organic film layer, and can further include a gate insulating layer, which is disposed on a side of the organic film layer opposing to the substrate. In some preferred embodiment, the sealing film can be disposed to additionally cover a portion of the gate insulating layer adjacent to an opening of the groove.

There are different embodiments regarding to the location of the bottom of the groove and the shape of the groove. In some embodiments, the bottom of the groove is on the substrate, whereas in others, the bottom of the groove is on or in the gate protection layer. A cross-section of the groove can be shaped as an arc, a semicircle arc, a square, a trapezoid, an inverted trapezoid, or preferably a rectangle.

In a second aspect, the present disclosure provides a display panel, which comprises an array substrate according to any of the embodiments as disclosed above, an opposing substrate; and a sealant, disposed between the array substrate and the opposing substrate. The sealant is disposed in the groove, with an end surface of a first end of the sealant and an end surface of a second end of the sealant securely attaching with a bottom surface of the groove and a surface of the opposing substrate respectively.

In some embodiments of the display panel, at least one of a secure attachment between the end surface of the first end of the sealant and the bottom surface of the groove and a secure attachment between the end surface of the second end of the sealant and the surface of the opposing substrate is through bonding.

In some embodiments of the display panel, a gap can be arranged between the sealant and at least one side wall of the groove, and the opposing substrate can be a color film substrate or a packaging substrate.

In a third aspect, the present disclosure provides a method for manufacturing an array substrate, which includes the following steps:

Sequentially forming a gate protection layer, an organic film layer, and a gate insulating layer over a substrate;

Forming a groove over the substrate, wherein the groove extends through the organic film layer.

In some embodiments, after the step of forming a groove over the substrate, the method further comprises a step of: forming a sealing film over the groove, such that the sealing film covers surfaces of the groove to thereby prevent gas release from the organic film layer.

The sealing film can additionally cover a portion of the gate insulating layer adjacent to an opening of the groove, and can comprises a transparent electrode.

In some embodiments of the method, the step of forming a groove over the substrate is performed by patterning.

Other embodiments and implementations may become apparent in view of the following descriptions and the attached drawings.

BRIEF DESCRIPTION OF DRAWINGS

To more clearly illustrate the embodiments of the disclosure, the following is a brief description of the drawings, which are for illustrative purpose only. For those of ordinary skills in the art, other drawings of other embodiments can become apparent based on these drawings.

DETAILED DESCRIPTION

In the following, with reference to the drawings of various embodiments disclosed herein, the technical solutions of the embodiments of the invention will be described in a clear and fully understandable way. It is noted that the described embodiments are merely a portion but not all of the embodiments of the invention. Based on the described embodiments of the invention, those ordinarily skilled in the art can obtain other embodiment(s), which come(s) within the scope sought for protection by the invention.

Figure 1:
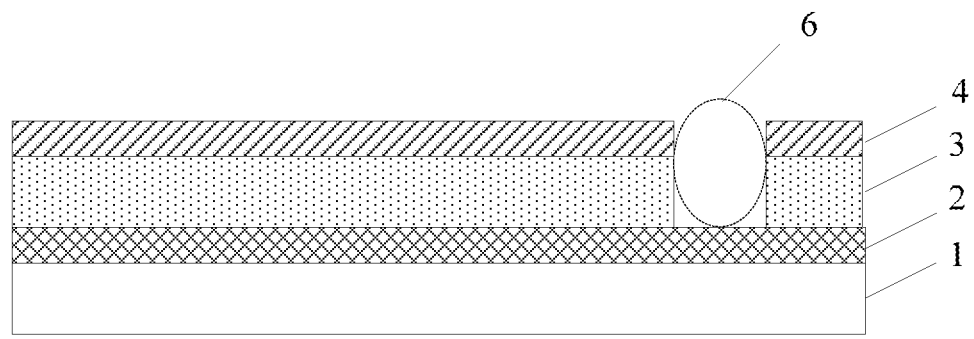
FIG. 1 is a schematic diagram of the structure of an array substrate according to a first embodiment of the disclosure.

With reference to FIG. 1, this disclosure provides an array substrate, which includes a substrate 1, a gate protection layer 2, an organic film layer 3, and an insulating layer 4, sequentially formed over the substrate 1. The array substrate is provided with a groove 6, configured for positioning a sealant 5. The groove 6 extends from the insulating layer 4 to the gate protection layer 2 in a direction perpendicular to the substrate, and is also configured to expose the gate protection layer 2.

It is noted that the array substrate typically includes a display area and a non-display area, and the sealant is arranged on the non-display area of the array substrate. In some embodiments of the disclosure, the groove 6 is arranged on the non-display area of the array substrate, surrounding the whole display area.

In a direction vertical to the array substrate, the groove 6 has a cross-sectional pattern including arc, semicircle arc, square, rectangle, trapezoid, and inverted trapezoid, which can be arranged depending on specific needs. In some preferred embodiments, the cross-sectional pattern of the groove 6 is rectangle, as illustrated in FIG. 1, whose manufacturing is simple and easy.

In this embodiment, the groove 6 is arranged at the position of the sealant 5, which exposes the gate protection layer 2. The organic film layer 3 is not disposed below the sealant 5, and the sealant 5 is bonded directly with the gate protection layer 2.

As such, even under high temperature, high pressure and high humidity, where the organic film layer 3 has poorer adhesion with the adjacent layers due to its relatively large tensile stress difference, the contact between the sealant 5 and the gate protection layer 2 is not substantially affected, thereby allowing the maintenance of a good sealing performance of the sealant.

Figure 2:
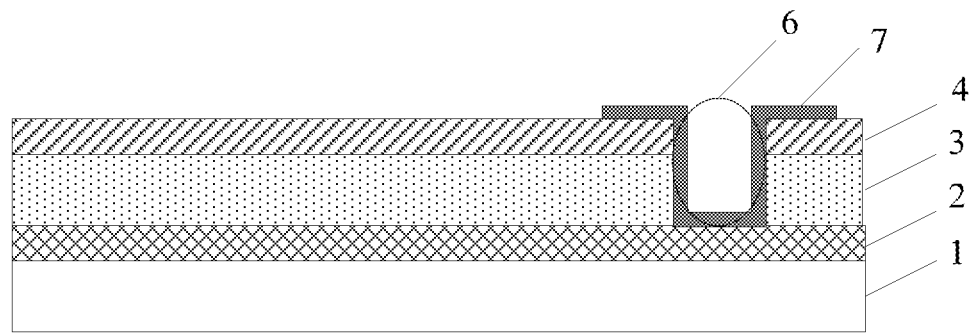
FIG. 2 is a schematic diagram of the structure of an array substrate according to a second embodiment of the disclosure.

In order to avoid the effects of the gas released from the organic film layer 3 at the side walls of the groove 6 on the adhesion between the sealant 5 and the gate protection layer 2, in some embodiments as shown in FIG. 2, the surface of the groove 6 can be provided with a transparent electrode 7, which also covers a portion of the gate insulating layer 4 that is adjacent to the opening of the groove.

As such, the transparent electrode 7 arranged on the surface of the groove 6 can seal the side walls of the groove 6, which further avoids the issue that the adhesion between the sealant 5 and the gate protection layer 2 becomes poorer due to the environmental impacts on the organic film layer 3 on the side walls of the groove 6.

Additionally, the transparent electrode 7 covers a portion of the gate insulating layer 4 that is adjacent to the opening of the groove, which can reduce the requirement for accuracy during manufacturing of the transparent electrode on the surface of the groove, and can allow a better sealing performance.

In some embodiments, the transparent electrode 7 comprises indium tin oxide.

In some embodiments, the array substrate further comprises a gate electrode metal layer, disposed between the gate insulating layer 4 and the substrate 1.

The embodiments of the present disclosure have the following beneficial effects.

The groove 6 is arranged at the position of the sealant 5, extending from the gate insulating layer 4 to the gate protection layer 2, which allows the direct bonding between the sealant 5 and the gate protection layer 2.

Because the organic film layer 3 is not disposed below the sealant 5, the issue that the adhesion between the sealant 5 and the gate protection layer 2 becomes poorer due to the environmental impacts on the organic film layer 3 can be avoided, which allows the maintenance of a good sealing performance of the sealant 5.

Figure 3:
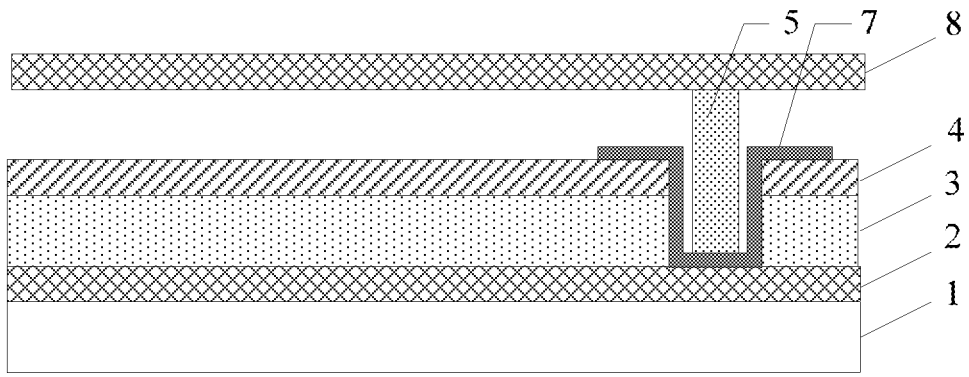
FIG. 3 is a schematic diagram of a local structure of a display panel according to some embodiment of the disclosure.

In another aspect, the present disclosure provides a display panel. FIG. 3 is a cross-sectional view of a display panel at the position of the sealant according to some embodiment of the disclosure. The display panel includes the array substrate as described above, and an opposing substrate 8 that is disposed oppositely to the array substrate, and the sealant 5 disposed between the array substrate and the opposing substrate 8. One end of the sealant 5 is arranged within the groove 6 in the array substrate, whose end surface is bonded with the bottom surface of the groove 6, and the other end surface of the sealant 5 is bonded to the opposing substrate 8.

In some embodiments, a gap can be arranged between the sealant 5 and side walls of the groove 6. As such, the following issue with no gap arranged can be avoided. When forming the groove 6, the segment difference formed between the gate insulating layer 4 and the organic film layer 3 and the segment difference formed between the organic film layer 3 and the gate protection layer 2 are not in a same vertical direction at the junction of the groove region and its adjacent region. When the sealant 5 is coated on the uneven segment differences, the adhesion between the sealant 5 and the gate protection layer 2 will be affected, and the quality of the display panel will also be affected.

In some embodiments, an opposing substrate 8 is a color film substrate or a packaging substrate.

The embodiments of the disclosure have the following beneficial effects. The groove 6 is arranged at the position of the sealant 5, extending from the gate insulating layer 4 to the gate protection layer 2 and allowing the direct bonding between the sealant 5 and the gate protection layer 2.

Because the organic film layer 3 is not disposed below the sealant 5, the issue that the sealing between the sealant 5 and the gate protection layer 2 becomes poorer due to the environmental impacts on the organic film layer 3 can be avoided.

In yet another aspect, the present disclosure provides a display apparatus, which comprises the display panel as described in the embodiments as disclosed above.

Figure 4:
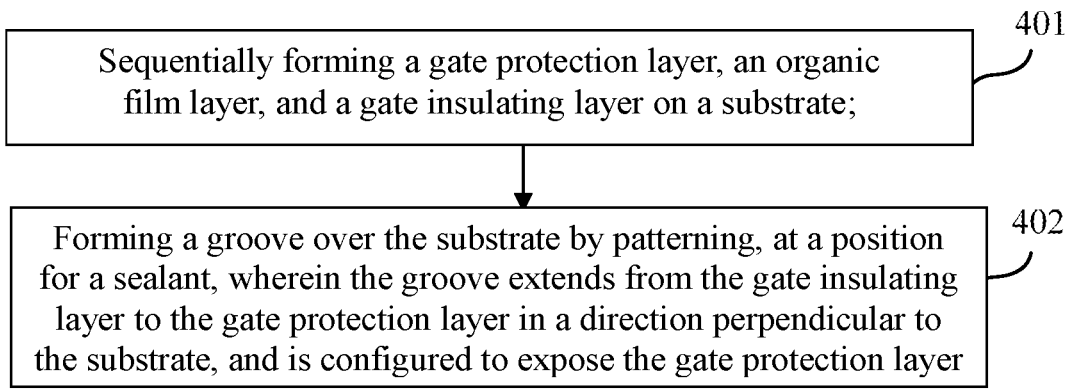
FIG. 4 is a flow chart of manufacturing an array substrate according to a first embodiment of the disclosure.

With reference to FIG. 4, the present disclosure provides a method for manufacturing an array substrate according to a first embodiment. The method comprises the following steps:

401: Sequentially forming a gate protection layer, an organic film layer, and a gate insulating layer over a substrate;

402: Forming a groove over the substrate by patterning, at a position for a sealant, wherein the groove extends from the gate insulating layer to the gate protection layer in a direction perpendicular to the substrate, and is configured to expose the gate protection layer.

Figure 5:
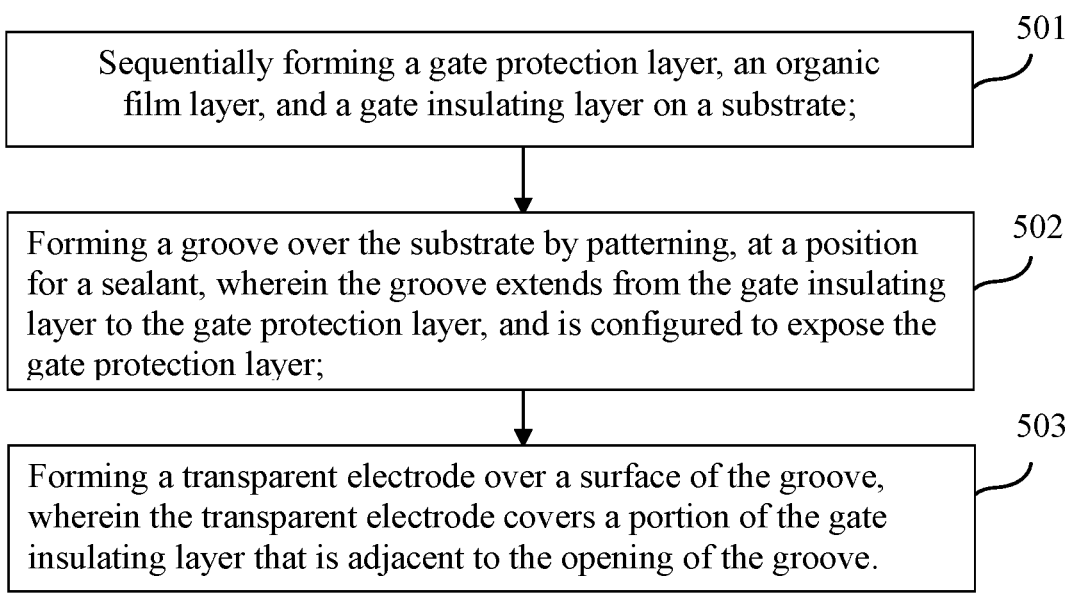
FIG. 5 is a flow chart of manufacturing an array substrate according to a second embodiment of the disclosure.

As illustrated in FIG. 5, the present disclosure provides a method for manufacturing an array substrate according to a second embodiment, which includes the following steps.

501: Sequentially forming a gate protection layer, an organic film layer, and a gate insulating layer over a substrate;

502: Forming a groove over the substrate by patterning, at a position for a sealant, wherein the groove extends from the gate insulating layer to the gate protection layer, and is configured to expose the gate protection layer.

503: Forming a transparent electrode over a surface of the groove, wherein the transparent electrode covers a portion of the gate insulating layer that is adjacent to the opening of the groove.

In some embodiments, prior to forming the gate protection layer over the substrate, the method further comprises forming a gate electrode metal layer over the substrate.

Figure 6:
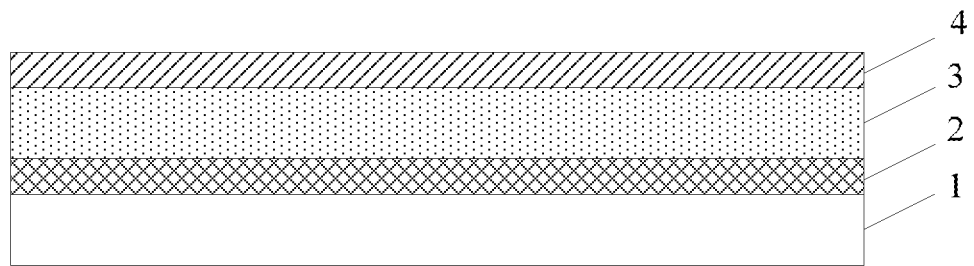
FIG. 6 is a schematic diagram of a gate protection layer, an organic film layer, and an insulating layer, sequentially formed on the array substrate in some embodiments of the disclosure.
Figure 7:
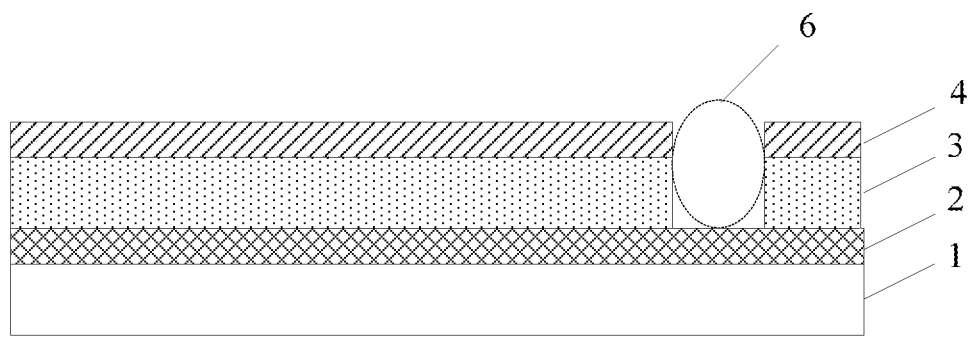
FIG. 7 is a schematic diagram of grooves formed on the array substrate in some embodiments of the disclosure.
Figure 8:
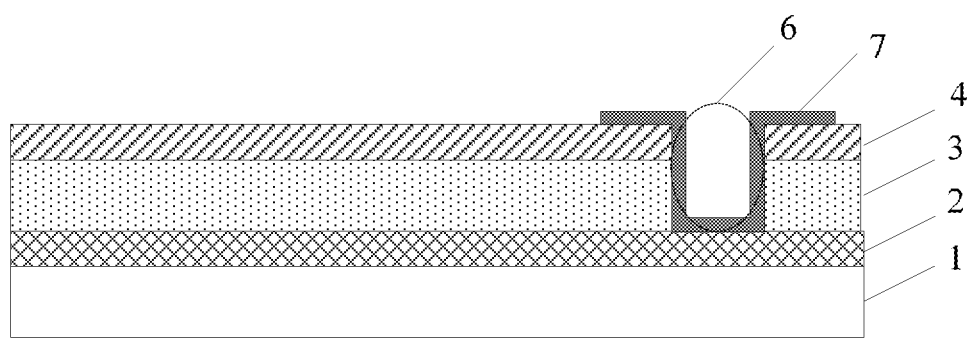
FIG. 8 is a schematic diagram of transparent electrodes formed on the array substrate in some embodiments of the disclosure

To more clearly illustrate the method for manufacturing an array substrate disclosed herein, the array substrate as shown in FIG. 2 is taken as an example, and the method is described in detail with reference to FIGS. 6-8.

Step 11: Sequentially forming a gate protection layer 2, an organic film layer 3, and a gate insulating layer 4 over a substrate 1, as shown in FIG. 6. Specifically for this step, various appropriate approaches can be selected depending on the compositions used for the gate protection layer 2, the organic film layer 3, and the gate insulating layer 4.

Step 12: Forming a groove 6 over the substrate by patterning, at a position for a sealant 5. As shown in FIG. 7, the groove 6 extends from the gate insulating layer 4 to the gate protection layer 2 in a direction vertical to the substrate, and is configured to expose the gate protection layer 2. Specifically for this step, various appropriate patterning processes can be selected depending on the compositions used for the gate protection layer 2, the organic film layer 3, and the gate insulating layer 4.

Step 13: Forming a transparent electrode 7 on a surface of the groove 6, wherein the transparent electrode 7 covers a portion of the gate insulating layer 4, as shown in FIG. 8.

Figure 9:
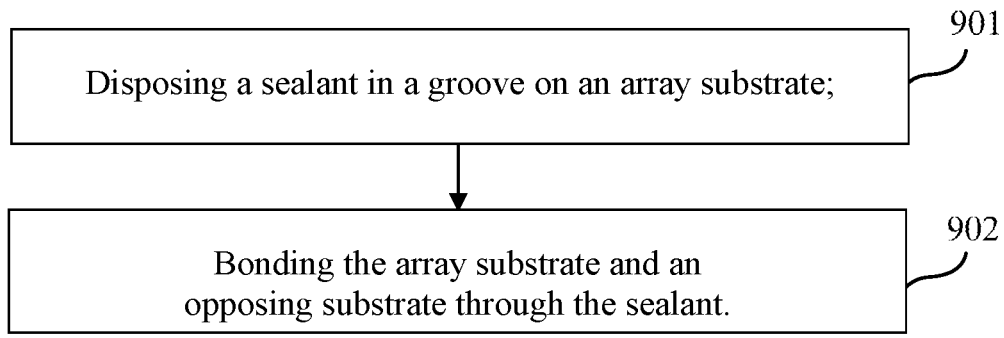
FIG. 9 is a flow chart of manufacturing a display panel according to some embodiment of the disclosure.

As illustrated in FIG. 9, the present disclosure provides a method for manufacturing a display panel according to some embodiment, which includes the following steps.

901: Disposing a sealant in a groove on an array substrate;

902: Bonding the array substrate and an opposing substrate through the sealant.

The array substrate as shown in FIG. 2 is taken as an example to illustrate the method for manufacturing a display panel disclosed herein.

Figure 10:
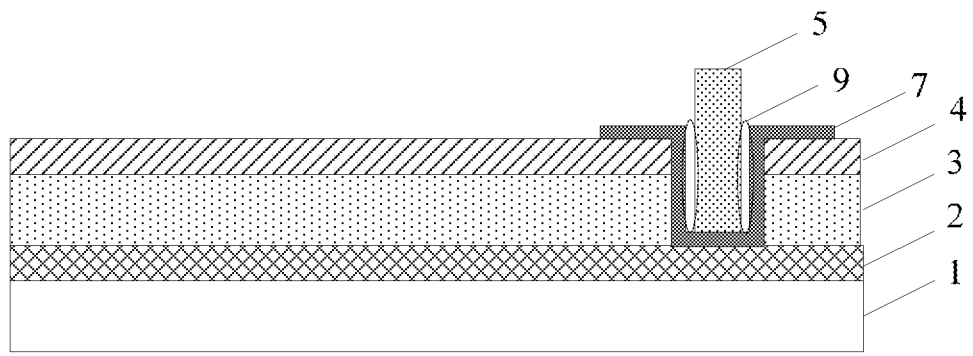
FIG. 10 is a schematic diagram of a sealant formed at grooves on the array substrate in some embodiments of the disclosure.

Step 21: Disposing a sealant 5 in a groove 6 on an array substrate, as shown in FIG. 10. Specifically, when forming the sealant 5 in the groove 6, a gap 9 is arranged between the sealant 5 and side wall of the groove 6.

Figure 11:
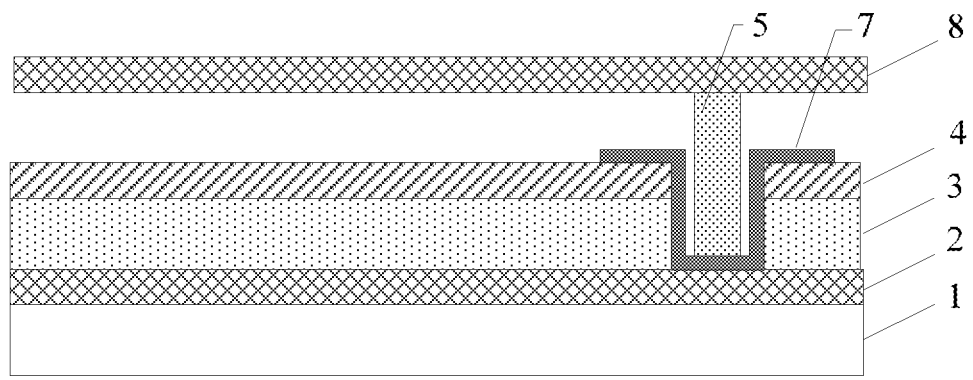
FIG. 11 is a schematic diagram of opposing substrates formed on the array substrate in some embodiments of the disclosure.

Step 22: Bonding the array substrate and an opposing substrate 8 through the sealant 5, to thereby form a display panel, as shown in FIG. 11.

The embodiments of the present disclosure have the following beneficial effects. The groove 6 is arranged at the position of the sealant 5, extending from the gate insulating layer 4 to the gate protection layer 2, which allows the direct bonding between the sealant 5 and the gate protection layer 2. Because the organic film layer 3 is not disposed below the sealant 5, the issue that the bonding between the sealant 5 and the gate protection layer 2 becomes poorer due to the environmental impacts on the organic film layer 3 can be avoided, which allows the maintenance of a good sealing performance of the sealant 5.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display panel comprising an array substrate, comprising an organic film layer, disposed over a substrate, wherein:
   the array substrate is provided with a groove, configured for positioning a sealant at a direction substantially vertical to the substrate while leaving a gap between the sealant and at least one side wall of the groove,
   the groove extending through the organic film layer, and having an opening on a side opposing to the substrate;
   the display panel further comprises an opposing substrate;
   the sealant is disposed between the array substrate and the opposing substrate;
   the sealant is disposed in the groove with an end surface of a first end of the sealant and an end surface of a second end of the sealant securely attaching with a bottom surface of the groove and a surface of the opposing substrate respectively; while having the gap between the sealant and at least one side wall of the groove.

2. The display panel of claim 1, further comprising a sealing film, covering surfaces of the groove to thereby prevent gas release from the organic film layer.

3. The display panel of claim 2, wherein the sealing film is a transparent electrode.

4. The display panel of claim 3, wherein the transparent electrode comprises indium tin oxide.

5. The display panel of claim 1, further comprising a gate protection layer, disposed between the substrate and the organic film layer.

6. The display panel of claim 5, further comprising a gate insulating layer, disposed on a side of the organic film layer opposing to the substrate.

7. The display panel of claim 6, wherein the sealing film is disposed to additionally cover a portion of the gate insulating layer adjacent to an opening of the groove.

8. The display panel of claim 5, wherein a bottom of the groove is on the substrate.

9. The display panel of claim 5, wherein a bottom of the groove is on or in the gate protection layer.

10. The display panel of claim 1, wherein a cross-section of the groove is shaped as an arc, a semicircle arc, a square, a rectangle, a trapezoid, or an inverted trapezoid.

11. The display panel of claim 10, wherein the cross-section of the groove is shaped as a rectangle.

12. The display panel according to claim 1, wherein at least one of a secure attachment between the end surface of the first end of the sealant and the bottom surface of the groove and a secure attachment between the end surface of the second end of the sealant and the surface of the opposing substrate is through bonding.

13. The display panel according to claim 1, wherein the opposing substrate is a color film substrate or a packaging substrate.

14. A method for manufacturing the display panel of claim 1, the method comprising:
   sequentially forming a gate protection layer, the organic film layer, and a gate insulating layer over substrate; and
   forming the groove over the substrate, wherein the groove extends through the organic film layer.

15. The method according to claim 14, further comprising, after the forming the groove over the substrate, a step of:
   forming a sealing film over the groove, such that the sealing film covers surfaces of the groove to thereby prevent gas release from the organic film layer.

16. The method according to claim 15, wherein the sealing film additionally covers a portion of the gate insulating layer adjacent to an opening of the groove.

17. The method according to claim 16, wherein the sealing film is a transparent electrode.

18. The method according to claim 14, wherein the forming the groove over the substrate is performed by patterning.

* * * * *